(12) United States Patent
Chen (10) Patent No.: US 10,907,097 B2
(45) Date of Patent: Feb. 2, 2021

(54) METHOD AND APPARATUS FOR PREPARING QUANTUM DOTS

(71) Applicant: BOE TECHNOLOGY GROUP CO., LTD., Beijing (CN)

(72) Inventor: Zhuo Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 429 days.

(21) Appl. No.: 15/744,970

(22) PCT Filed: Apr. 13, 2017

(86) PCT No.: PCT/CN2017/080429
§ 371 (c)(1),
(2) Date: Jan. 15, 2018

(87) PCT Pub. No.: WO2017/190582
PCT Pub. Date: Nov. 9, 2017

(65) Prior Publication Data
US 2018/0208843 A1 Jul. 26, 2018

(30) Foreign Application Priority Data
May 6, 2016 (CN) .......................... 2016 1 0299241

(51) Int. Cl.
*B82Y 20/00* (2011.01)
*C09K 11/88* (2006.01)
(Continued)

(52) U.S. Cl.
CPC .......... *C09K 11/883* (2013.01); *C09K 11/665* (2013.01); *C30B 7/00* (2013.01);
(Continued)

(58) Field of Classification Search
CPC ....... B82Y 20/00; B82Y 40/00; C09K 11/665; C09K 11/883; Y02P 20/544;
(Continued)

(56) References Cited

U.S. PATENT DOCUMENTS 5,789,027 A * 8/1998 Watkins .................. B05D 1/18
427/250
2007/0265357 A1 11/2007 Iversen et al.
(Continued)

FOREIGN PATENT DOCUMENTS

CN 1909955 A 2/2007
CN 104045076 A 9/2014
(Continued)

OTHER PUBLICATIONS

Ohde et al, "Water in Co2 microemulsions as nanoreactors for sythnesizing cds and zns nanoparticles in supercritical co2," Nano letters, vol. 2 No. 7, p. 721-724 (Year: 2002).*
(Continued)

*Primary Examiner* — Matthew J Song
(74) *Attorney, Agent, or Firm* — Intellectual Valley Law, P.C.

(57) ABSTRACT

The present application discloses a method of preparing quantum dots. The method includes combining a first quantum dots precursor and a second quantum dots precursor to form a first reaction mixture including a supercritical liquid medium; nucleating and growing the quantum dots from the first quantum dots precursor and the second quantum dots precursor in the first reaction mixture including the supercritical liquid medium; and forming a solid quantum dots material in the presence of the supercritical liquid medium.

15 Claims, 5 Drawing Sheets

(51) Int. Cl.
*C09K 11/66* (2006.01)
*H01L 21/02* (2006.01)
*C30B 7/00* (2006.01)
*C30B 29/60* (2006.01)
*B82Y 40/00* (2011.01)

(52) U.S. Cl.
CPC ........ *C30B 29/605* (2013.01); *H01L 21/0256* (2013.01); *H01L 21/02557* (2013.01); *H01L 21/02601* (2013.01); *B82Y 20/00* (2013.01); *B82Y 40/00* (2013.01); *Y02P 20/54* (2015.11)

(58) Field of Classification Search
CPC ......... H01L 21/02601; H01L 21/02557; H01L 21/0256; C30B 29/605; C30B 7/00
See application file for complete search history.

(56) References Cited

U.S. PATENT DOCUMENTS

| 2010/0178227 | A1* | 7/2010 | Kim | C01B 13/32 423/263 |
| 2011/0104043 | A1* | 5/2011 | Niesz | A61P 11/00 423/509 |
| 2011/0303269 | A1 | 12/2011 | Kim et al. | |
| 2013/0136687 | A1* | 5/2013 | Darr | B01J 19/0093 423/592.1 |
| 2015/0028288 | A1* | 1/2015 | Onicha | H01L 21/02628 257/26 |
| 2018/0107065 | A1* | 4/2018 | Heuclin | G02F 1/133603 |

FOREIGN PATENT DOCUMENTS

| CN | 104250552 A | 12/2014 |
| CN | 105923625 A | 9/2016 |
| JP | 2015017046 A | 1/2015 |
| WO | 2011030170 A1 | 3/2011 |

OTHER PUBLICATIONS

International Search Report & Written Opinion dated Jul. 12, 2017, regarding PCT/CN2017/080429.
First Office Action in the Chinese Patent Application No. 201610299241. X, dated Sep. 13, 2017; English translation attached.
Continuous synthesis of high quality CdSe quantum dots in supercritical fluids, Arkajyoti Chakrabarty et al., J. Mater. Chem. C, 2015, 3, 7561-7566 (Jun. 22, 2015).
Preparation of Nanomaterials in Flow at Supercritical Conditions from Coordination Complexes, Samuel Marre et al., Top Organomet Chem, 177-211 (Feb. 20, 2016).
Investigation of Indium Phosphide Nanocrystal Synthesis Using a High-Temperature and High-Pressure Continuous Flow Microreactor, Jinyong Baek et al., Angew. Chem. Int. Ed., vol. 50, 627-630 (Nov. 31, 2011).

* cited by examiner

METHOD AND APPARATUS FOR PREPARING QUANTUM DOTS

CROSS-REFERENCE TO RELATED APPLICATION

This application is a national stage application under 35 U.S.C. § 371 of International Application No. PCT/CN2017/080429, filed Apr. 13, 2017, which claims priority to Chinese Patent Application No. 201610299241.X, filed May 6, 2016, the contents of which are incorporated by reference in the entirety.

TECHNICAL FIELD

The present invention relates to nanotechnology, more particularly, to quantum dots, a method of preparing quantum dots, and an apparatus for preparing quantum dots.

BACKGROUND

The quantum dots material has excellent optical and electrical properties, including a narrow emission peak (with a half-peak width of approximately 30 nm), a tunable spectrum (ranging from visible light to infrared light), high photochemical stability, and a low starting voltage. Due to these excellent properties, quantum dots have become a focus of research and development in the fields of optoelectronic technology, biotechnology, pharmaceuticals, security technology, electronic engineering, and energy source technology.

SUMMARY

In one aspect, the present invention provides a method of preparing quantum dots, comprising combining a first quantum dots precursor and a second quantum dots precursor to form a first reaction mixture comprising a supercritical liquid medium; nucleating and growing the quantum dots from the first quantum dots precursor and the second quantum dots precursor in the first reaction mixture comprising the supercritical liquid medium; and forming a solid quantum dots material in the presence of the supercritical liquid medium.

Optionally, nucleating and growing the quantum dots comprises nucleating the quantum dots under a first reaction condition comprising a first reaction temperature and a first reaction atmosphere, and increasing a size of the quantum dots under a second reaction condition comprising a second reaction temperature and a second reaction atmosphere, the first reaction condition being different from the second reaction condition.

Optionally, forming the solid quantum dots material comprises, subsequent to nucleating and growing the quantum dots, precipitating the quantum dots in the presence of the supercritical liquid medium thereby forming the solid quantum dots material.

Optionally, precipitating the quantum dots in the presence of the supercritical liquid medium comprises at least adjusting temperature of the supercritical liquid medium.

Optionally, the method further comprises purifying the quantum dots by separating the solid quantum dots material from the first reaction mixture comprising the supercritical liquid medium to form a separated solid quantum dots material, thereby substantially removing unreacted precursors from the solid quantum dots material.

Optionally, combining the first quantum dots precursor and the second quantum dots precursor comprises combining a first quantum dots precursor solution comprising the supercritical liquid medium and the first quantum dots precursor, and a second quantum dots precursor solution comprising the supercritical liquid medium and the second quantum dots precursor.

Optionally, at least one of the first quantum dots precursor solution and the second quantum dots precursor solution further comprises an organic solvent; and the method further comprises purifying the quantum dots by separating the solid quantum dots material from the first reaction mixture comprising the supercritical liquid medium to form a separated solid quantum dots material, thereby substantially removing unreacted precursors and the organic solvent from the solid quantum dots material.

Optionally, prior to combining the first quantum dots precursor solution and the second quantum dots precursor solution, further comprising forming the first quantum dots precursor solution by dissolving at least a part of the first quantum dots precursor in the supercritical fluid medium; and forming the second quantum dots precursor solution by dissolving at least a part of the second quantum dots precursor in the supercritical fluid medium.

Optionally, forming the first quantum dots precursor solution comprises mixing the first quantum dots precursor with a first organic solvent to form a first intermediate solution, and mixing the first intermediate solution with the supercritical fluid medium; and forming the second quantum dots precursor solution comprises mixing the second quantum dots precursor with a second organic solvent to form a second intermediate solution, and mixing the second intermediate solution with the supercritical fluid medium.

Optionally, subsequent to nucleating and growing the quantum dots, further comprising combining the first reaction mixture with an overcoat precursor to form a second reaction mixture comprising the supercritical liquid medium; and reacting the overcoat precursor with the quantum dots under a third reaction condition comprising a third reaction temperature and a third reaction atmosphere; wherein the solid quantum dots material comprises core-shell quantum dots.

Optionally, prior to combining the first reaction mixture with the overcoat precursor, further comprising quenching the first reaction mixture to arrest growth of the quantum dots.

Optionally, forming the solid quantum dots material comprises, subsequent to reacting the overcoat precursor with the quantum dots, precipitating the core-shell quantum dots in the presence of the supercritical liquid medium thereby forming the solid quantum dots material.

Optionally, precipitating the quantum dots in the presence of the supercritical liquid medium comprises at least adjusting temperature of the supercritical liquid medium.

Optionally, the method further comprises purifying the quantum dots by separating the solid quantum dots material from the second reaction mixture comprising the supercritical liquid medium to form a separated solid quantum dots material, thereby substantially removing unreacted precursors from the solid quantum dots material.

Optionally, the method further comprises drying the separated solid quantum dots material to form a dry powder.

Optionally, the method further comprises dissolving the separated solid quantum dots material in a dispersing agent to form a quantum dots solution.

Optionally, the supercritical fluid medium comprises one or a combination of supercritical fluids selected from the group consisting of a supercritical carbon dioxide, a supercritical alcohol, a supercritical water, a supercritical alkane, a supercritical acetone, a supercritical tetrahydrofuran, a supercritical acetic acid, a supercritical citric acid, and a supercritical N, N-dimethylformamide.

Optionally, the supercritical alcohol comprises one or a combination of supercritical alcohols selected from the group consisting of a supercritical methanol, a supercritical ethanol a supercritical propanol, a supercritical isopropanol, a supercritical butanol, a supercritical pentanol, and a supercritical ethylene glycol.

Optionally, the supercritical alkane comprises one or a combination of supercritical alkanes selected from the group consisting of a supercritical methane, a supercritical ethane, a supercritical propane, a supercritical butane, a supercritical pentane, a supercritical hexane, a supercritical cyclohexane, and a supercritical heptane.

Optionally, the supercritical fluid medium comprises a supercritical carbon dioxide.

Optionally, the method is a continuous flow method.

In another aspect, the present invention provides a quantum dots material prepared by the method described herein.

In another aspect, the present invention provides an apparatus for preparing quantum dots, comprising at least one quantum dots precursor vessel; at least one reactor; and a solid-liquid separator; wherein the at least one quantum dots precursor vessel are configured to be in fluid communication with the at least one reactor; and the solid-liquid separator is configured to be in fluid communication with the at least one reactor.

Optionally, the at least one quantum dots precursor vessel comprise a first quantum dots precursor vessel and a second quantum dots precursor vessel; the at least one reactor comprise a first reactor and a second reactor; the first quantum dot precursor vessel and the second quantum dot precursor vessel are respectively configured to be in fluid communication with the first reactor; and the solid-liquid separator is configured to be in fluid communication with the second reactor.

Optionally, the apparatus further comprises a first high-pressure pump for introducing a first quantum dots precursor in the first quantum dots precursor vessel into the first reactor; and a second high-pressure pump for introducing a second quantum dots precursor in the second quantum dots precursor vessel into the first reactor.

Optionally, the apparatus further comprises at least one overcoat precursor vessel configured to be in fluid communication with the second reactor.

Optionally, the apparatus further comprises a third high-pressure pump for introducing at least one overcoat precursor in the at least one overcoat precursor vessel into the second reactor; wherein the third high-pressure pump is configured to be in fluid communication with the at least one overcoat precursor vessel.

Optionally, the solid-liquid separator comprises a gas outlet for releasing a gas.

Optionally, the solid-liquid separator comprises an inlet for receiving a dispersing agent and an outlet for releasing a quantum dots solution; the inlet is configured to be in fluid communication with a dispersing agent vessel; and the outlet is configured to be in fluid communication with a quantum dots solution collector.

Optionally, the apparatus further comprises a real-time reaction monitor for monitoring a quantum dots reaction in the at least one reactor.

Optionally, the at least one reactor comprises at least one reactor channel comprising a microtubing.

Optionally, the apparatus is a continuous flow apparatus.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Conventional quantum dots synthesis methods are typically hot injection-based methods. For example, a first precursor solution may be added to a thermostatic vessel under an inert atmosphere and heated to the desired temperature. Subsequently, a second precursor solution was rapidly added into the thermostatic vessel. The conventional quantum dots synthesis methods use organic solvents as the reaction medium. Examples of organic solvents used in the conventional methods include organophosphorus ligands (such as trioctylphosphine, trioctylphosphine oxide, etc.) and high boiling point solvents (such as octadecene). Ligand-type solvents typically are highly toxic. Non-ligand-type solvents such as octadecene are not as toxic, but are relatively costly thus add to the costs of fabrication. Moreover, solvent removal and quantum dots purification when high boiling point solvents are used typically involve a complicated process, further adding to the costs of quantum dots preparation. For example, in some conventional methods, an anti-solvent is used for precipitating the quantum dots. Use of the anti-solvent further increases the manufacturing costs. Thus, the conventional quantum dots synthesis processes are not scalable and associated with high costs.

Accordingly, the present invention provides, inter alia, quantum dots, a method of preparing quantum dots, and an apparatus for preparing quantum dots that substantially obviate one or more of the problems due to limitations and disadvantages of the related art. In one aspect, the present disclosure provides a method of preparing quantum dots. In some embodiments, the method includes combining a first quantum dots precursor and a second quantum dots precursor to form a first reaction mixture having a supercritical liquid medium; nucleating and growing the quantum dots from the first quantum dots precursor and the second quantum dots precursor in the first reaction mixture having the supercritical liquid medium; and forming a solid quantum dots material in the presence of the supercritical liquid medium.

In some embodiments, the quantum dots are prepared using a hot injection method, the method including dissolving the reactant materials in a supercritical fluid medium; adjusting the reaction temperature and reaction pressure of the reaction vessel containing the reactant materials dissolved in the supercritical fluid medium; nucleating and growing the quantum dots in the supercritical fluid medium; and purifying the quantum dots in the supercritical fluid medium. As compared to the conventional method, the present method has the advantages of low toxicity, low costs, and improved processability. Moreover, the present method has a greatly simplified purification step. A high-purity quantum dots end product may be obtained efficiently using the present method.

Figure 1:
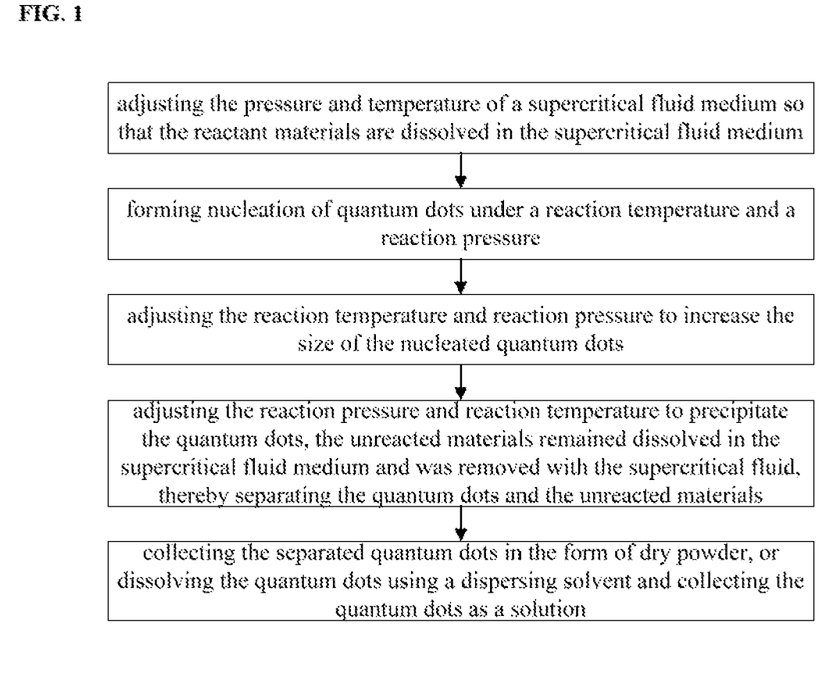
FIG. 1 is a flow chart illustrating a process of preparing quantum dots in some embodiments according to the present disclosure.

FIG. 1 is a flow chart illustrating a process of preparing quantum dots in some embodiments according to the present disclosure. Referring to FIG. 1, the process in some embodiments includes adjusting the atmospheric pressure and temperature of a supercritical fluid medium so that the reactant materials are dissolved in the supercritical fluid medium; forming nucleation of quantum dots under a reaction temperature and a reaction pressure; adjusting the reaction temperature and reaction pressure to increase the size of the nucleated quantum dots; adjusting the reaction pressure and reaction temperature to precipitate the quantum dots, the unreacted materials remained dissolved in the supercritical fluid medium and was removed with the supercritical fluid, thereby separating the quantum dots and the unreacted materials; and collecting the separated quantum dots in the form of dry powder, or dissolving the quantum dots using a dispersing solvent and collecting the quantum dots as a solution.

Figure 2:
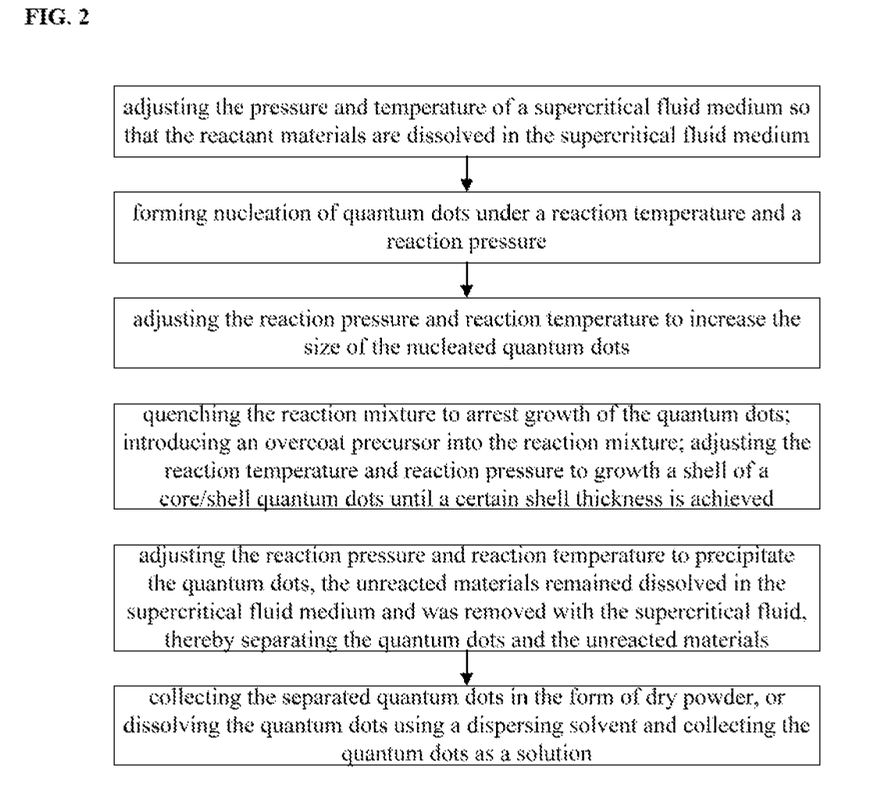
FIG. 2 is a flow chart illustrating a process of preparing quantum dots in some embodiments according to the present disclosure.

FIG. 2 is a flow chart illustrating a process of preparing quantum dots in some embodiments according to the present disclosure. Referring to FIG. 2, the process in some embodiments includes adjusting the atmospheric pressure and temperature of a supercritical fluid medium so that the reactant materials are dissolved in the supercritical fluid medium; forming nucleation of quantum dots under a reaction temperature and a reaction pressure; adjusting the reaction temperature and reaction pressure to increase the size of the nucleated quantum dots; quenching the reaction mixture to arrest growth of the quantum dots; introducing an overcoat precursor into the reaction mixture; adjusting the reaction temperature and reaction pressure to growth a shell of a core/shell quantum dots until a certain shell thickness is achieved; adjusting the reaction pressure and reaction temperature to precipitate the quantum dots, the unreacted materials remained dissolved in the supercritical fluid medium and was removed with the supercritical fluid, thereby separating the quantum dots and the unreacted materials; and collecting the separated quantum dots in the form of dry powder, or dissolving the quantum dots using a dispersing solvent and collecting the quantum dots as a solution.

In some embodiments, the step of nucleating and growing the quantum dots includes nucleating the quantum dots under a first reaction condition having a first reaction temperature and a first reaction atmosphere; and increasing a size of the quantum dots (e.g., "growing") under a second reaction condition having a second reaction temperature and a second reaction atmosphere, the first reaction condition being different from the second reaction condition. Optionally, the first reaction temperature is in a range of approximately 100 degree Celsius to approximately 400 degree Celsius, e.g., approximately 150 degree Celsius to approximately 330 degree Celsius. Optionally, the second reaction temperature is in a range of approximately 100 degree Celsius to approximately 300 degree Celsius, e.g., approximately 150 degree Celsius to approximately 260 degree Celsius. Optionally, the second reaction temperature is lower than the first reaction temperature.

In some embodiments, the step of forming the solid quantum dots material includes, subsequent to nucleating and growing the quantum dots, precipitating the quantum dots in the presence of the supercritical liquid medium thereby forming the solid quantum dots material. Optionally, the step of precipitating the quantum dots in the presence of the supercritical liquid medium includes at least adjusting temperature of the supercritical liquid medium. Optionally, the step of precipitating the quantum dots in the presence of the supercritical liquid medium includes at least adjusting temperature and atmospheric pressure of the supercritical liquid medium.

In some embodiments, the method further includes purifying the quantum dots by separating the solid quantum dots material from the first reaction mixture having the supercritical liquid medium to form a separated solid quantum dots material, thereby substantially removing unreacted precursors from the solid quantum dots material.

In some embodiments, the step of combining the first quantum dots precursor and the second quantum dots precursor includes combining a first quantum dots precursor solution in the supercritical liquid medium and a second quantum dots precursor solution in the supercritical liquid medium. Optionally, at least one of the first quantum dots precursor solution and the second quantum dots precursor solution further includes an organic solvent. Optionally, both the first quantum dots precursor solution and the second quantum dots precursor solution further include an organic solvent. Examples of organic solvents include oleic acid, trioctylphosphine, and oleyl amine. Optionally, the first quantum dots precursor solution and the second quantum dots precursor solution do not further include an organic solvent. Optionally, the method further includes purifying the quantum dots by separating the solid quantum dots material from the first reaction mixture having the supercritical liquid medium to form a separated solid quantum dots material, thereby substantially removing unreacted precursors and the organic solvent from the solid quantum dots material. Optionally, prior to combining the first quantum dots precursor solution and the second quantum dots precursor solution, the method further includes forming the first quantum dots precursor solution by dissolving at least a part of the first quantum dots precursor in the supercritical fluid medium; and forming the second quantum dots precursor solution by dissolving at least a part of the second quantum dots precursor in the supercritical fluid medium. Optionally, the step of forming the first quantum dots precursor solution includes mixing the first quantum dots precursor with a first organic solvent to form a first intermediate solution, and mixing the first intermediate solution with the supercritical fluid medium. Optionally, the step of forming the second quantum dots precursor solution includes mixing the second quantum dots precursor with a second organic solvent to form a second intermediate solution, and mixing the second intermediate solution with the supercritical fluid medium.

In some embodiments, the separated solid quantum dots material may be dried to form a dry powder. Optionally, the method further includes drying the separated solid quantum dots material to form a dry powder. In some embodiments, the separated solid quantum dots material may be dissolved in a dispersing agent to form a solution. Optionally, the method further includes dissolving the separated solid quantum dots material in a dispersing agent to form a quantum dots solution.

In some embodiments, the method is a method for preparing a core/shell quantum dots. Optionally, subsequent to nucleating and growing the quantum dots, the method further includes combining the first reaction mixture with an overcoat precursor to form a second reaction mixture having the supercritical liquid medium; and reacting the overcoat precursor with the quantum dots under a third reaction condition having a third reaction temperature and a third reaction atmosphere. The solid quantum dots material includes core-shell quantum dots. Optionally, prior to combining the first reaction mixture with the overcoat precursor, the method further includes quenching the first reaction mixture to arrest growth of the quantum dots. Optionally, the quenching in performed at a quenching temperature in a range of approximately 50 degree Celsius to approximately 150 degree Celsius, e.g., approximately 100 degree Celsius. Optionally, the third reaction temperature is in a range of approximately 250 degree Celsius to approximately 350 degree Celsius, e.g., approximately 300 degree Celsius.

In some embodiments, the step of forming the solid quantum dots material includes, subsequent to reacting the overcoat precursor with the quantum dots, precipitating the core-shell quantum dots in the presence of the supercritical liquid medium thereby forming the solid quantum dots material. Optionally, the step of precipitating the quantum dots in the presence of the supercritical liquid medium includes at least adjusting temperature of the supercritical liquid medium. Optionally, the step of precipitating the quantum dots in the presence of the supercritical liquid medium includes at least adjusting temperature and atmospheric pressure of the supercritical liquid medium. Optionally, the method further includes purifying the quantum dots by separating the solid quantum dots material from the second reaction mixture having the supercritical liquid medium to form a separated solid quantum dots material, thereby substantially removing unreacted precursors from the solid quantum dots material.

Various supercritical fluid mediums may be used for carrying out the present method. Examples of appropriate supercritical fluid mediums include, but are not limited to, a supercritical carbon dioxide, a supercritical alcohol, a supercritical water, a supercritical alkane, a supercritical acetone, a supercritical tetrahydrofuran, a supercritical acetic acid, a supercritical citric acid, and a supercritical N, N-dimethylfomamide. Optionally, the supercritical fluid medium includes one or a combination of supercritical fluids selected from the group consisting of a supercritical carbon dioxide, a supercritical alcohol, a supercritical water, a supercritical alkane, a supercritical acetone, a supercritical tetrahydrofuran, a supercritical acetic acid, a supercritical citric acid, and a supercritical N, N-dimethylformamide. By adjusting the temperature and atmospheric pressure of the supercritical fluid mediums, the reactant materials may be thoroughly dissolved in the supercritical fluid mediums. When the reaction is complete, the unreacted precursors and toxic organic solvents may be conveniently separated from solid quantum dots end products by removing the supercritical fluid mediums, in which the unreacted precursors and toxic organic solvents remain dissolved. Examples of appropriate supercritical alcohols include, but are not limited to, a supercritical methanol, a supercritical ethanol, a supercritical propanol, a supercritical isopropanol, a supercritical butanol, a supercritical pentanol, and a supercritical ethylene glycol. Optionally, the supercritical alcohol includes one or a combination of supercritical alcohols selected from the group consisting of a supercritical methanol, a supercritical ethanol, a supercritical propanol, a supercritical isopropanol, a supercritical butanol, a supercritical pentanol, and a supercritical ethylene glycol. Examples of appropriate supercritical alkanes include, but are not limited to, a supercritical methane, a supercritical ethane, a supercritical propane, a supercritical butane, a supercritical pentane, a supercritical hexane, a supercritical cyclohexane, and a supercritical heptane. Optionally, the supercritical alcohol includes one or a combination of supercritical alkanes selected from the group consisting of a supercritical methane, a supercritical ethane, a supercritical propane, a supercritical butane, a supercritical pentane, a supercritical hexane, a supercritical cyclohexane, and a supercritical heptane. Optionally, the supercritical fluid medium includes a supercritical carbon dioxide.

In some embodiments, the supercritical fluid medium is a supercritical carbon dioxide. Carbon dioxide has the characteristics of extremely low toxicity, low cost, and a suitable critical constant (Tc=31.1° C., Pc=72.8 atm, dc=0.47 g/cm$^3$).

In some embodiments, the method is a continuous flow method.

Different quantum dots require different reactions conditions, e.g., different reaction conditions for nucleation, quantum dots growth, and shell growth. In one example, CdSe quantum dots are synthesized from cadmium oxide and selenium, the nucleation and growth are performed under a reaction pressure of 10 MPa and a reaction temperature in a range of approximately 260 degree Celsius to approximately 330 degree Celsius. In another example, CsPbBr$_3$ quantum dots are synthesized from cesium carbonate and lead bromide, the nucleation and growth are performed under a reaction pressure of 10 MPa and a reaction temperature in a range of approximately 150 degree Celsius to approximately 200 degree Celsius. In another example, CdSe/ZnS core/shell quantum dots are synthesized from cadmium oxide, selenium, zinc acetate, and sulfur, the nucleation and growth are performed under a reaction pressure of 10 MPa and a reaction temperature in a range of approximately 260 degree Celsius to approximately 330 degree Celsius, and the shell growth is performed under a reaction pressure of 10 MPa and a reaction temperature of approximately 300 degree Celsius. The present method is suitable for preparing various quantum dots.

In another aspect, the present disclosure provides a quantum dots material made by a method described herein. The quantum dots material made by the present method has a higher purity and enhanced properties as compared to conventional quantum dots.

In another aspect, the present disclosure provides an apparatus for preparing quantum dots. In some embodiments, the apparatus includes at least one quantum dots precursor vessel; at least one reactor; and a solid-liquid separator. Optionally, the at least one quantum dots precursor vessel are configured to be in fluid communication with the at least one reactor. Optionally, the solid-liquid separator is configured to be in fluid communication with the at least one reactor. In some embodiments, the apparatus includes a first quantum dots precursor vessel; a second quantum dots precursor vessel; a first reactor, a second reactor, and a solid-liquid separator. Optionally, the first quantum dots precursor vessel and the second quantum dots precursor vessel are respectively configured to be in fluid communication with the first reactors. Optionally, the solid-liquid separator is configured to be in fluid communication with the second reactors.

In some embodiments, the apparatus further includes a high-pressure pump, e.g., a high-pressure gas cylinder. Optionally, the apparatus includes a first high-pressure pump for introducing a first quantum dots precursor in the first quantum dots precursor vessel into the first reactor; and a second high-pressure pump for introducing a second quantum dots precursor in the second quantum dots precursor vessel into the first reactor. The first high-pressure pump and the second first high-pressure pump may be a same high-pressure gas cylinder.

In some embodiments, the apparatus further includes at least one overcoat precursor vessel configured to be in fluid communication with the second reactor. Optionally, the apparatus includes a first overcoat precursor vessel and a second overcoat precursor vessel.

In some embodiments, the apparatus further includes a third high-pressure pump for introducing at least one overcoat precursor in the at least one overcoat precursor vessel into the second reactor. Optionally, the third high-pressure pump, the first high-pressure pump, and the second first high-pressure pump may be a same high-pressure pump, e.g., a same high-pressure gas cylinder. The third high-pressure pump is configured to be in fluid communication with the at least one overcoat precursor vessel.

In some embodiments, the solid-liquid separator includes a gas outlet for releasing a gas. In some embodiments, the solid-liquid separator includes an inlet for receiving a dispersing agent and an outlet for releasing a quantum dots solution. Optionally, the inlet is configured to be in fluid communication with a dispersing agent vessel. Optionally, the outlet is configured to be in fluid communication with a quantum dots solution collector.

In some embodiments, the apparatus further includes a real-time reaction monitor for monitoring a quantum dots reaction in the at least one reactor.

In some embodiments, the at least one reactor includes at least one reactor channel having a microtubing.

In some embodiments, the apparatus is a continuous flow apparatus.

Figure 3:
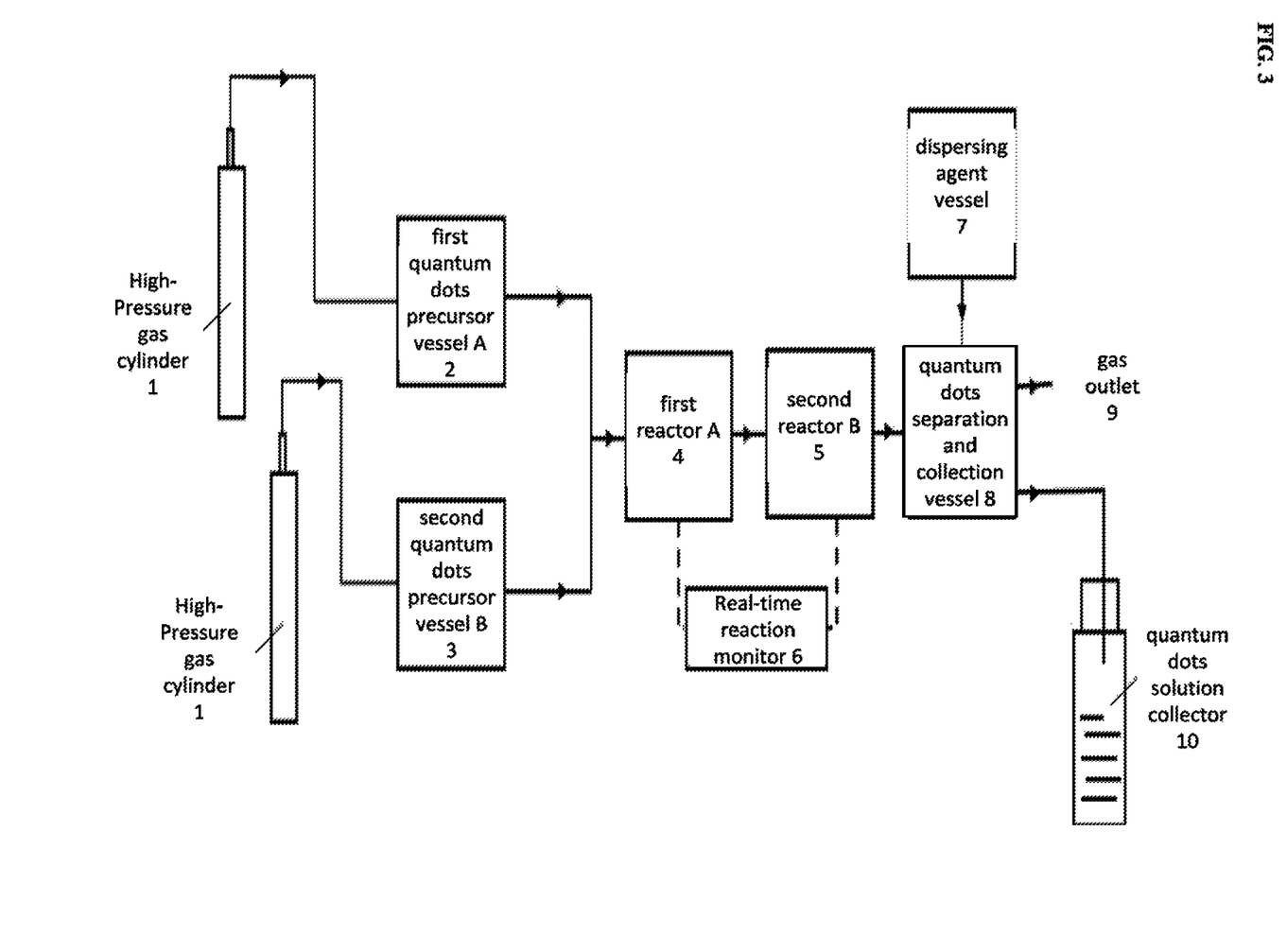
FIG. 3 is a schematic diagram illustrating the structure of an apparatus for preparing quantum dots in some embodiments according to the present disclosure.

FIG. 3 is a schematic diagram illustrating the structure of an apparatus for preparing quantum dots in some embodiments according to the present disclosure. Referring to FIG. 3, the apparatus in some embodiments includes a first quantum dots precursor vessel A 2, a second quantum dots precursor vessel B 3, a first reactor A 4, a second reactor B 5, and a quantum dots separation and collection vessel 8. The quantum dots separation and collection vessel 8 includes a solid-liquid separator.

The inlet of the first quantum dots precursor vessel A 2 is connected to a high-pressure gas cylinder 1 for introducing reactant materials (e.g., a first quantum dots precursor) for forming quantum dots (e.g., the core portion of the quantum dots) into a reactor. The inlet of the second quantum dots precursor vessel B 3 is connected to the high-pressure gas cylinder 1 for introducing reactant materials (e.g., a second quantum dots precursor) for forming quantum dots (e.g., the core portion of the quantum dots) into a reactor. The outlet of the first quantum dots precursor vessel A 2 is connected to a first reactor A 4. The outlet of the second quantum dots precursor vessel B 3 is connected to the first reactor A 4. Optionally, the outlets of the first quantum dots precursor vessel A 2 and the second quantum dots precursor vessel B 3 are merged first before they are connected to the first reactor A 4. The first reactor A 4 is in turn connected to the second reactor B 5, which is in turn connected to the quantum dots separation and collection vessel 8. The quantum dots separation and collection vessel 8 includes a gas outlet 9.

As shown in FIG. 3, the apparatus further includes a real-time reaction monitor connected to the first reactor A 4 and the second reactor B 5, respectively. The real-time reaction monitor monitors a quantum dots reaction in the first reactor A 4 and the second reactor B 5.

As shown in FIG. 3, the apparatus further includes a dispersing agent vessel 7 for introducing a dispersing agent (e.g., a solvent for dissolving quantum dots) into the quantum dots separation and collection vessel 8. The quantum dots separation and collection vessel 8 includes an inlet connected to the dispersing agent vessel 7 for receiving the dispersing agent. The apparatus further includes a quantum dots solution collector 10 for collecting a quantum dots solution. The quantum dots separation and collection vessel 8 includes an outlet connected to the quantum dots solution collector 10 for dispensing the quantum dots solution.

In one example, the apparatus is operated as follows to synthesize quantum dots:

(1) A first quantum dots precursor is added into the first quantum dots precursor vessel A 2; and a second quantum dots precursor is added into the second quantum dots precursor vessel B 3. The atmospheric pressures and temperatures of the supercritical fluid medium in the first quantum dots precursor vessel A 2 and the second quantum dots precursor vessel B 3 are adjusted so that the reactant materials (precursors and solvents) are thoroughly mixed and dissolved.

(2) The reactant materials in the first quantum dots precursor vessel A 2 and the second quantum dots precursor vessel B 3 are introduced into the first reactor A 4. For example, the reactant materials in the first quantum dots precursor vessel A 2 may be pumped by the high-pressure gas cylinder 1 into the first reactor A 4, and the reactant materials in the second quantum dots precursor vessel B 3 may be pumped by the high-pressure gas cylinder 1 into the first reactor A 4. The first reactor A 4 has a relatively higher temperature, in which quantum dots nucleation occurs.

(3) The reaction mixture in the first reactor A 4 is then pumped into the second reactor B 5 by the high-pressure gas cylinder 1. The second reactor B 5 has a relatively lower temperature as compared to the first reactor A 4. The temperature is controlled in a range suitable for the growth of nucleated quantum dots. The real-time reaction monitor 6 (such as a fluorescence spectrophotometer) is connect the first reactor A 4 and the second reactor B 5 for monitoring the quantum dots reaction in the first reactor A 4 and the second reactor B 5.

(4) When the quantum dot grows to a desired size, the quantum dots reaction mixture in the supercritical fluid medium is pumped to the quantum dots separation and collection vessel 8. The temperature and the atmospheric pressure of the supercritical fluid medium are adjusted so that the quantum dots aggregate and precipitate. The excess precursors and organic solvents remain dissolved in the supercritical fluid medium and are subsequently discharged together with the supercritical fluid medium.

(5) The resulting quantum dots dry powder can be retained in the quantum dots separation and collection vessel 8. The quantum dots can be directly collected in the form of a dry powder. Alternatively, a dispersing agent may be added to the quantum dots separation and collection vessel 8 to dissolve the quantum dots. The dispersing agent may be one or a combination of solvents such as toluene, chloroform or n-hexane, and may be added into the quantum dots separation and collection vessel 8 from the dispersing agent vessel 7. The dissolved quantum dots may be collected in the quantum dots solution collector 10.

Figure 4:
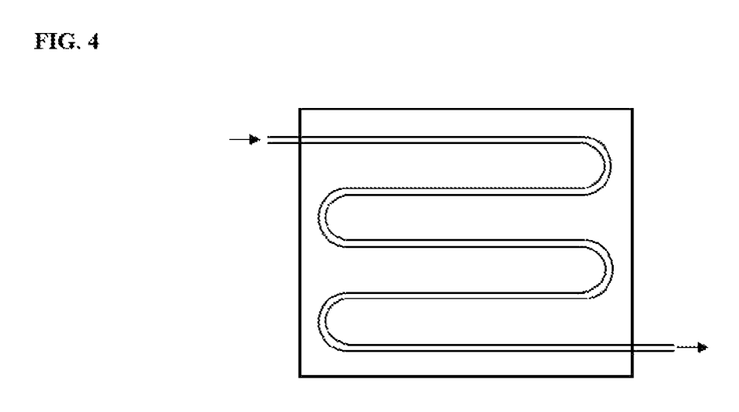
FIG. 4 is a schematic diagram illustrating the structure of a reactor having a microtubing in some embodiments according to the present disclosure.

In some embodiments, the quantum dots precursor vessels and the reactors include at least one reactor channel having a microtubing. For example, the quantum dots precursor vessels and the reactors may include a capillary or microfluidic device. FIG. 4 is a schematic diagram illustrating the structure of a reactor having a microtubing in some embodiments according to the present disclosure. The capillary/microfluidic device can precisely and quickly adjust the temperature of the quantum dots precursor vessels and the reactors, thereby controlling the dissolution of the reactant materials. Separate nucleation and growth conditions can be achieved with the rapid and precise temperature control by the capillary/microfluidic device. The capillary/microfluidic device can be temperature controlled by means of oil bath, microwave, infrared, electric heating, or the like.

Figure 5:
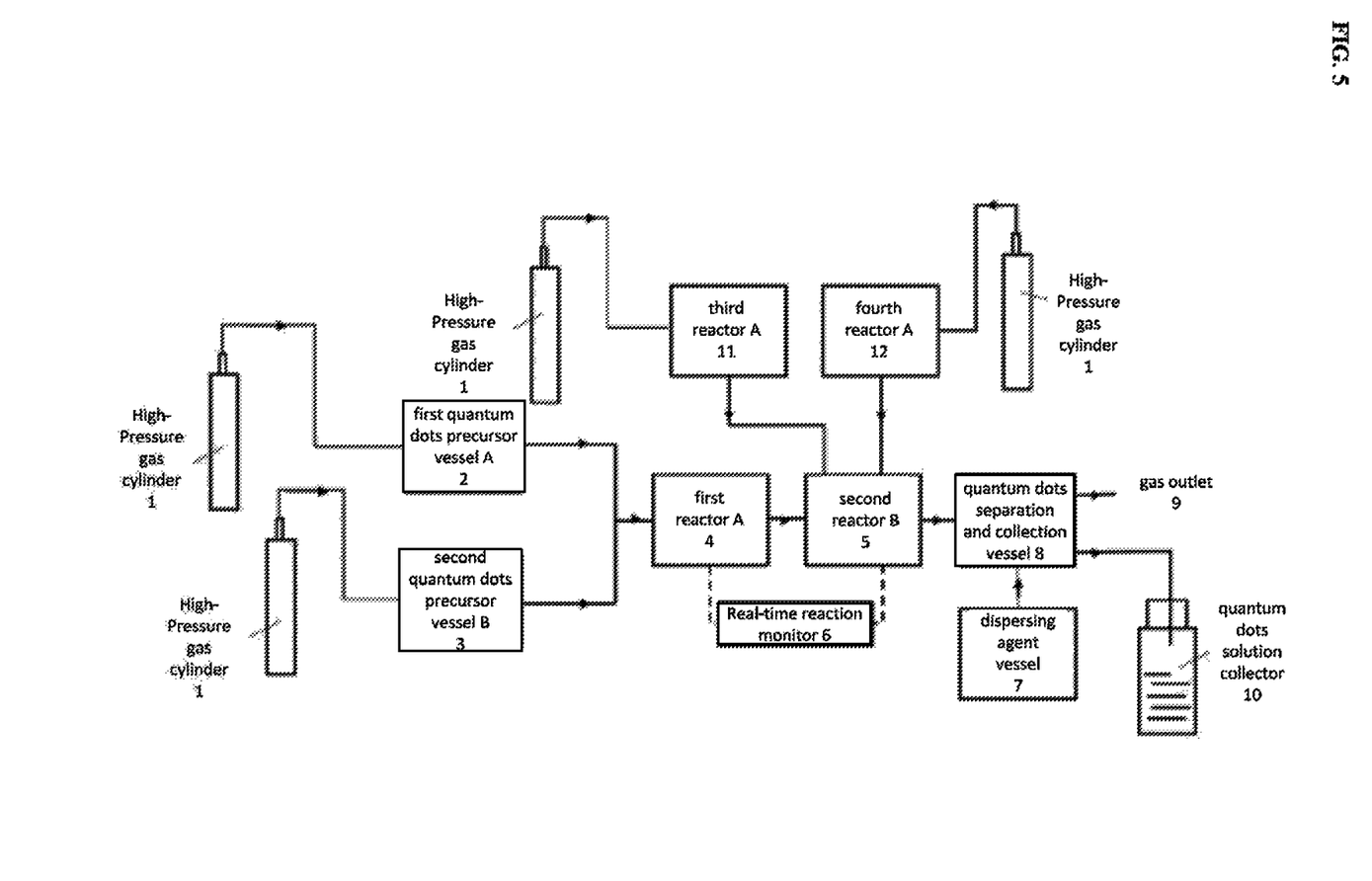
FIG. 5 is a schematic diagram illustrating the structure of an apparatus for preparing quantum dots in some embodiments according to the present disclosure.

In some embodiments, the quantum dots are core/shell quantum dots. FIG. 5 is a schematic diagram illustrating the structure of an apparatus for preparing quantum dots in some embodiments according to the present disclosure. Referring to FIG. 5, in addition to the components of the apparatus as shown in FIG. 3, the apparatus in FIG. 5 further includes a first overcoat precursor vessel A 11 and a second overcoat precursor vessel B 12. The inlet of the first overcoat precursor vessel A 11 is connected to the high-pressure gas cylinder 1 for introducing reactant materials (e.g., a first overcoat precursor) for forming quantum dots (e.g., the shell portion of the quantum dots) into a reactor. The inlet of the second overcoat precursor vessel B 12 is connected to the high-pressure gas cylinder 1 for introducing reactant materials (e.g., a second overcoat precursor) for forming quantum dots (e.g., the shell portion of the quantum dots) into a reactor. The outlet of the first overcoat precursor vessel A 11 is connected to a second reactor B 5. The outlet of the second overcoat precursor vessel B 12 is connected to the second reactor B 5.

In one example, the apparatus is operated as follows to synthesize core/shell quantum dots:

(1) A first quantum dots precursor is added into the first quantum dots precursor vessel A 2; and a second quantum dots precursor is added into the second quantum dots precursor vessel B 3. The atmospheric pressures and temperatures of the supercritical fluid medium in the first quantum dots precursor vessel A 2 and the second quantum dots precursor vessel B 3 are adjusted so that the reactant materials (precursors and solvents) are thoroughly mixed and dissolved.

(2) The reactant materials in the first quantum dots precursor vessel A 2 and the second quantum dots precursor vessel B 3 are introduced into the first reactor A 4. For example, the reactant materials in the first quantum dots precursor vessel A 2 may be pumped by the high-pressure gas cylinder 1 into the first reactor A 4, and the reactant materials in the second quantum dots precursor vessel B 3 may be pumped by the high-pressure gas cylinder 1 into the first reactor A 4. The first reactor A 4 has a relatively higher temperature, in which nucleation of the core portion of the quantum dots occurs.

(3) The reaction mixture in the first reactor A 4 is then pumped into the second reactor B 5 by the high-pressure gas cylinder 1. The second reactor B 5 has a relatively lower temperature as compared to the first reactor A 4. The temperature is controlled in a range suitable for the growth of nucleated quantum dots. The real-time reaction monitor 6 (such as a fluorescence spectrophotometer) is connect the first reactor A 4 and the second reactor B 5 for monitoring the quantum dots reaction in the first reactor A 4 and the second reactor B 5.

(4) When the core portion of the quantum dot grows to a desired size, the reaction temperature is lowered to quench the reaction mixture in the second reactor B 5 and arrest the growth of the core portion of the quantum dots. The reactant materials in the first overcoat precursor vessel A 11 and the second overcoat precursor vessel B 12 are introduced into the second reactor B 5. For example, the reactant materials in the first overcoat precursor vessel A 11 may be pumped by the high-pressure gas cylinder 1 into the second reactor B 5, and the reactant materials in the second overcoat precursor vessel B 12 may be pumped by the high-pressure gas cylinder 1 into the second reactor B 5. The reaction temperature of the second reactor B 5 was controlled (e.g., rapidly increased) to promote the growth of the shell on the quantum dots core. If necessary, this step may be repeated until a desired shell thickness was achieved. For example, after the first round of shell growth, the reaction temperature may be lowered to quench the reaction mixture in the second reactor B 5 and arrest the core/shell quantum dots growth, additional overcoat precursors may be added into the second reactor B 5, and the reaction temperature may be rapidly increased again to start the second round of shell growth.

(5) When the shell thickness grows to a desired size, the core/shell quantum dots reaction mixture in the supercritical fluid medium is pumped to the quantum dots separation and collection vessel 8. The temperature and the atmospheric pressure of the supercritical fluid medium are adjusted so that the quantum dots aggregate and precipitate. The excess precursors and organic solvents remain dissolved in the supercritical fluid medium and are subsequently discharged together with the supercritical fluid medium.

(6) The resulting core/shell quantum dots dry powder can be retained in the quantum dots separation and collection vessel 8. The core/shell quantum dots can be directly collected in the form of a dry powder. Alternatively, a dispersing agent may be added to the quantum dots separation and collection vessel 8 to dissolve the core/shell quantum dots. The dispersing agent may be one or a combination of solvents such as toluene, chloroform or n-hexane, and may be added into the quantum dots separation and collection vessel 8 from the dispersing agent vessel 7. The dissolved core/shell quantum dots may be collected in the quantum dots solution collector 10.

The present quantum dots synthesis method is a hot injection-based method that includes dissolving the reactant materials in a supercritical fluid medium; adjusting the reaction temperature and reaction pressure of the reaction vessel containing the reactant materials dissolved in the supercritical fluid medium; nucleating and growing the quantum dots in the supercritical fluid medium; and purifying the quantum dots in the supercritical fluid medium. As compared to the conventional methods and apparatuses, the present method and apparatus has the advantages of low toxicity, low costs, and improved processability.

The present method and apparatus can be adapted into a continuous flow method and apparatus for preparing all steps of quantum dots synthesis, including nucleation, core growth, shell growth, separation, and purification, in a single continuous flow process. The process is extensively scalable, and the properties of the synthesized quantum dots are superior to quantum dots prepared by conventional methods and apparatuses.

Moreover, a greatly simplified purification step can be achieved using the present method and apparatus. For example, the present method and apparatus purify the synthesized quantum dots by adjusting temperature (and optionally atmospheric pressure) of the supercritical fluid medium thereby altering quantum dots solubility in the supercritical fluid medium, thereby obviating the need of using an anti-solvent. Upon the adjustment (e.g., a temperature adjustment, a pressure adjustment, a temperature and pressure adjustment), the quantum dots aggregate and precipitate out of the supercritical fluid medium, whereas unreacted precursors and excess solvents remain dissolved in the supercritical fluid medium. The contaminates such as unreacted precursors and excess solvents can be conveniently separated and subsequently removed from the quantum dots products. A high-purity quantum dots end product can be obtained efficiently using the present method and apparatus. The fabrication costs can be significantly lowered by reducing the usage of organic solvent in the reaction.

EXAMPLES

Example 1: Preparation of CdSe Quantum Dots

The CdSe quantum dots were prepared using an apparatus as shown in FIG. 3. A mixture of cadmium oxide (CdO) and oleic acid (OA) (600 mg of cadmium oxide and 10 ml of oleic acid) was added to a first quantum dots precursor vessel A 2. Carbon dioxide gas was then introduced into the first quantum dots precursor vessel A 2. The pressure of the first quantum dots precursor vessel A 2 was adjusted to 10 MPa, and the temperature of the first quantum dots precursor vessel A 2 was adjusted to 220 degree Celsius, converting the carbon dioxide into a supercritical state. Cadmium oxide, oleic acid, and the supercritical carbon dioxide were mixed thoroughly to dissolve cadmium oxide in the supercritical carbon dioxide.

A mixture of trioctylphosphine and selenium having a selenium concentration of 320 mg/ml is added to a second quantum dots precursor vessel B 3. Carbon dioxide gas was introduced into the second quantum dots precursor vessel B 3. The pressure of the second quantum dots precursor vessel B 3 was adjusted to 10 MPa, and the temperature of the second quantum dots precursor vessel B 3 was adjusted to 150 degree Celsius, converting the carbon dioxide into a supercritical state. Selenium, trioctylphosphine, and the supercritical carbon dioxide were mixed thoroughly to dissolve selenium in the supercritical carbon dioxide.

The mixture in the first quantum dots precursor vessel A 2 was introduced into a first reactor A 4 by a high-pressure pump (e.g., the high-pressure gas cylinder 1). The mixture in the second quantum dots precursor vessel B 3 was introduced into a first reactor A 4 by the high-pressure gas cylinder 1. The pressure of the first reactor A 4 was adjusted to 10 MPa, and the temperature of the first reactor A 4 was adjusted to 330 degree Celsius. Under this reaction condition, nucleation of the CdSe quantum dots was initiated.

The reaction mixture in the first reactor A 4 were then introduced into a second reactor B 5 by the high-pressure gas cylinder 1. The pressure of the second reactor B 5 was adjusted to 10 MPa, and the temperature of the second reactor B 5 was adjusted to 260 degree Celsius. Under this reaction condition, the nucleated CdSe quantum dots underwent growth inside the second reactor B 5, e.g., the size of the nucleated CdSe quantum dots increases under this reaction condition in the second reactor B 5.

The quantum dots reactions in the first reactor A 4 and the second reactor B 5 were monitored by a real-time fluorescence spectrophotometer. The reaction conditions were controlled based on the results of monitoring.

Upon completion of nucleation and growth of CdSe quantum dots respectively in the first reactor A 4 and the second reactor B 5, the reaction products in the second reactor B 5 was introduced into a quantum dots separation and collection vessel 8 by the high-pressure gas cylinder 1. The pressure and temperature in the quantum dots separation and collection vessel 8 were adjusted to precipitate the quantum dots into a solid quantum dots material. The excess oleic acid and trioctylphosphine ligand remained dissolved in the supercritical carbon dioxide. The solid quantum dots material was separated from the supercritical carbon dioxide solution. The supercritical carbon dioxide solution containing the oleic acid and trioctylphosphine was removed from the system. The solid quantum dots material was collected in a collection vessel.

Quantum dots were collected in the form of dry powder. Subsequently, the solid quantum dots material was dissolved in a dispersing agent (e.g., toluene, chloroform, n-hexane) to formed a quantum dots solution, and the quantum dots solution is collected in a quantum dots solution collector 10.

Example 2: Preparation of $CsPbBr_3$ Quantum Dots

The $CsPbBr_3$ quantum dots were prepared using an apparatus as shown in FIG. 3. A mixture of cesium carbonate ($Cs_2CO_3$) and oleic acid (OA) (772 mg of cadmium oxide and 10 mL of oleic acid) was added to a first quantum dots precursor vessel A 2. Carbon dioxide gas was then introduced into the first quantum dots precursor vessel A 2. The pressure of the first quantum dots precursor vessel A 2 was adjusted to 10 MPa, and the temperature of the first quantum dots precursor vessel A 2 was adjusted to 100 degree Celsius, converting the carbon dioxide into a supercritical state. Cesium carbonate, oleic acid, and the supercritical carbon dioxide were mixed thoroughly to dissolve cesium carbonate in the supercritical carbon dioxide.

A mixture of lead bromide, oleic acid, and oleyl amine (6.9 gram lead bromide, 10 ml oleic acid, and 10 ml oleyl amine) is added to a second quantum dots precursor vessel B 3. Carbon dioxide gas was introduced into the second quantum dots precursor vessel B 3. The pressure of the second quantum dots precursor vessel B 3 was adjusted to 10 MPa, and the temperature of the second quantum dots precursor vessel B 3 was adjusted to 100 degree Celsius, converting the carbon dioxide into a supercritical state. Lead bromide, oleic acid, oleyl amine, and the supercritical carbon dioxide were mixed thoroughly to dissolve lead bromide in the supercritical carbon dioxide.

The mixture in the first quantum dots precursor vessel A 2 was introduced into a first reactor A 4 by the high-pressure gas cylinder 1. The mixture in the second quantum dots precursor vessel B 3 was introduced into a first reactor A 4 by the high-pressure gas cylinder 1. The pressure of the first reactor A 4 was adjusted to 10 MPa. and the temperature of the first reactor A 4 was adjusted to 150 degree Celsius. Under this reaction condition, nucleation of the $CsPbBr_3$ quantum dots was initiated.

The reaction mixture in the first reactor A 4 were then introduced into a second reactor B 5 by the high-pressure gas cylinder 1. The pressure of the second reactor B 5 was adjusted to 10 MPa, and the temperature of the second reactor B 5 was adjusted to a value between 150 degree Celsius and 200 degree Celsius. Under this reaction condition, the nucleated CsPbBr$_3$ quantum dots underwent growth inside the second reactor B 5, e.g., the size of the nucleated CsPbBr$_3$ quantum dots increases under this reaction condition in the second reactor B 5.

The quantum dots reactions in the first reactor A 4 and the second reactor B 5 were monitored by a real-time fluorescence spectrophotometer. The reaction conditions were controlled based on the results of monitoring.

Upon completion of nucleation and growth of CsPbBr$_3$ quantum dots respectively in the first reactor A 4 and the second reactor B 5, the reaction products in the second reactor B 5 was introduced into a quantum dots separation and collection vessel 8 by the high-pressure gas cylinder 1. The pressure and temperature in the quantum dots separation and collection vessel 8 were adjusted to precipitate the quantum dots into a solid quantum dots material. The excess oleic acid and oleyl amine remained dissolved in the supercritical carbon dioxide. The solid quantum dots material was separated from the supercritical carbon dioxide solution. The supercritical carbon dioxide solution containing the oleic acid and oleyl amine was removed from the system. The solid quantum dots material was collected in a collection vessel.

Quantum dots were collected in the form of dry powder. Subsequently, the solid quantum dots material was dissolved in a dispersing agent (e.g., toluene, chloroform, n-hexane) to formed a quantum dots solution, and the quantum dots solution is collected in a quantum dots solution collector 10.

Example 3: Preparation of CdSe/ZnS Core/Shell Quantum Dots

The CdSe/ZnS Core/Shell quantum dots were prepared using an apparatus as shown in FIG. 5. A mixture of cadmium oxide (CdO) and oleic acid (OA) (600 mg of cadmium oxide and 10 ml of oleic acid) was added to a first quantum dots precursor vessel A 2. Carbon dioxide gas was then introduced into the first quantum dots precursor vessel A 2. The pressure of the first quantum dots precursor vessel A 2 was adjusted to 10 MPa, and the temperature of the first quantum dots precursor vessel A 2 was adjusted to 220 degree Celsius, converting the carbon dioxide into a supercritical state. Cadmium oxide, oleic acid, and the supercritical carbon dioxide were mixed thoroughly to dissolve cadmium oxide in the supercritical carbon dioxide.

A mixture of trioctylphosphine and selenium having a selenium concentration of 320 mg/ml is added to a second quantum dots precursor vessel B 3. Carbon dioxide gas was introduced into the second quantum dots precursor vessel B 3. The pressure of the second quantum dots precursor vessel B 3 was adjusted to 10 MPa. and the temperature of the second quantum dots precursor vessel B 3 was adjusted to 150 degree Celsius, converting the carbon dioxide into a supercritical state. Selenium, trioctylphosphine, and the supercritical carbon dioxide were mixed thoroughly to dissolve selenium in the supercritical carbon dioxide.

The mixture in the first quantum dots precursor vessel A 2 was introduced into a first reactor A 4 by the high-pressure gas cylinder 1. The mixture in the second quantum dots precursor vessel B 3 was introduced into a first reactor A 4 by the high-pressure gas cylinder 1. The pressure of the first reactor A 4 was adjusted to 10 MPa, and the temperature of the first reactor A 4 was adjusted to 330 degree Celsius. Under this reaction condition, nucleation of the CdSe quantum dots was initiated.

The reaction mixture in the first reactor A 4 were then introduced into a second reactor B 5 by the high-pressure gas cylinder 1. The pressure of the second reactor B 5 was adjusted to 10 MPa, and the temperature of the second reactor B 5 was adjusted to 260 degree Celsius. Under this reaction condition, the nucleated CdSe quantum dots underwent growth inside the second reactor B 5, e.g., the size of the nucleated CdSe quantum dots increases under this reaction condition in the second reactor B 5.

The quantum dots reactions in the first reactor A 4 and the second reactor B 5 were monitored by a real-time fluorescence spectrophotometer. The reaction conditions were controlled based on the results of monitoring.

A mixture of zinc acetate ($Zn(CH_3COO)_2$) and oleic acid (OA) (0.4 mmol zinc acetate and 10 mL of oleic acid) was added to a first overcoat precursor vessel A 11. Carbon dioxide gas was then introduced into the first overcoat precursor vessel A 11. The pressure of the first overcoat precursor vessel A 11 was adjusted to 10 MPa, and the temperature of the first overcoat precursor vessel A 11 was adjusted to 220 degree Celsius, converting the carbon dioxide into a supercritical state. Zinc acetate, oleic acid, and the supercritical carbon dioxide were mixed thoroughly to dissolve zinc acetate in the supercritical carbon dioxide.

A mixture of sulfur and trioctylphosphine having a sulfur concentration of 0.4 mmol/ml was added to a second overcoat precursor vessel B 12. Carbon dioxide gas was then introduced into the first overcoat precursor vessel A 11. The pressure of the second overcoat precursor vessel B 12 was adjusted to 10 MPa, and the temperature of the second overcoat precursor vessel B 12 was adjusted to 150 degree Celsius, converting the carbon dioxide into a supercritical state. Sulfur, trioctylphosphine, and the supercritical carbon dioxide were mixed thoroughly to dissolve sulfur in the supercritical carbon dioxide.

When the growth of the CdSe quantum dots reached a desired level, the reaction mixture in the second reactor B 5 was quenched to arrest the growth of the CdSe quantum dots, by lowering the temperature in the second reactor B 5 to 100 degree Celsius. The mixtures in the first overcoat precursor vessel A 11 and the second overcoat precursor vessel B 12 were then introduced into the second reactor B 5 in appropriate amounts. The reaction temperature of the second reactor B 5 was rapidly increased to 300 degree Celsius to promote the growth of ZnS shell on the CdSe quantum dots core. If necessary, this step was repeated until a desired shell thickness was achieved.

Upon completion of the synthesis of the CdSe—ZnS core-shell quantum dots, the reaction products in the second reactor B 5 was introduced into a quantum dots separation and collection vessel 8 by the high-pressure gas cylinder 1. The pressure and temperature in the quantum dots separation and collection vessel 8 were adjusted to precipitate the core-shell quantum dots into a solid core-shell quantum dots material. The excess oleic acid and trioctylphosphine ligand remained dissolved in the supercritical carbon dioxide. The solid core-shell quantum dots material was separated from the supercritical carbon dioxide solution. The supercritical carbon dioxide solution containing the oleic acid and trioctylphosphine was removed from the system. The solid core-shell quantum dots material was collected in a collection vessel.

Core-shell quantum dots were collected in the form of dry powder. Subsequently, the solid core-shell quantum dots material was dissolved in a dispersing agent (e.g., toluene, chloroform, n-hexane) to formed a core-shell quantum dots solution, and the core-shell quantum dots solution is collected in a quantum dots solution collector 10.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of preparing quantum dots, comprising:
   combining a first quantum dots precursor and a second quantum dots precursor to form a first reaction mixture comprising a supercritical liquid medium;
   nucleating and growing the quantum dots from the first quantum dots precursor and the second quantum dots precursor in the first reaction mixture comprising the supercritical liquid medium;
   subsequent to nucleating and growing the quantum dots, adjusting atmospheric pressure and temperature of the supercritical liquid medium to (1) directly precipitate the quantum dots out of the first reaction mixture without addition of any solvent, thereby forming a solid quantum dots material, and (2) maintain unreacted precursors substantially dissolved in a remaining first reaction mixture comprising the supercritical liquid medium; and
   separating the solid quantum dots material from the remaining first reaction mixture, thereby removing the unreacted precursors with the supercritical liquid medium from the solid quantum dots material.

2. The method of claim 1, wherein nucleating and growing the quantum dots comprises:
   nucleating the quantum dots under a first reaction condition comprising a first reaction temperature and a first reaction atmosphere; and
   increasing a size of the quantum dots under a second reaction condition comprising a second reaction temperature and a second reaction atmosphere, the first reaction condition being different from the second reaction condition.

3. The method of claim 1, wherein combining the first quantum dots precursor and the second quantum dots precursor comprises combining a first quantum dots precursor solution comprising the supercritical liquid medium and the first quantum dots precursor, and a second quantum dots precursor solution comprising the supercritical liquid medium and the second quantum dots precursor.

4. The method of claim 3, wherein at least one of the first quantum dots precursor solution and the second quantum dots precursor solution further comprises an organic solvent; and
   the method further comprises purifying the quantum dots by separating the solid quantum dots material from the first reaction mixture comprising the supercritical liquid medium to form a separated solid quantum dots material, thereby substantially removing unreacted precursors and the organic solvent from the solid quantum dots material.

5. The method of claim 3, prior to combining the first quantum dots precursor solution and the second quantum dots precursor solution, further comprising forming the first quantum dots precursor solution by dissolving at least a part of the first quantum dots precursor in the supercritical fluid medium; and
   forming the second quantum dots precursor solution by dissolving at least a part of the second quantum dots precursor in the supercritical fluid medium.

6. The method of claim 5, wherein forming the first quantum dots precursor solution comprises mixing the first quantum dots precursor with a first organic solvent to form a first intermediate solution, and mixing the first intermediate solution with the supercritical fluid medium; and
   forming the second quantum dots precursor solution comprises mixing the second quantum dots precursor with a second organic solvent to form a second intermediate solution, and mixing the second intermediate solution with the supercritical fluid medium.

7. The method of claim 1, subsequent to nucleating and growing the quantum dots, further comprising combining the first reaction mixture with an overcoat precursor to form a second reaction mixture comprising the supercritical liquid medium; and
   reacting the overcoat precursor with the quantum dots under a third reaction condition comprising a third reaction temperature and a third reaction atmosphere;
   wherein the solid quantum dots material comprises core-shell quantum dots.

8. The method of claim 7, prior to combining the first reaction mixture with the overcoat precursor, further comprising quenching the first reaction mixture to arrest growth of the quantum dots.

9. The method of claim 7, forming the solid quantum dots material comprises, subsequent to reacting the overcoat precursor with the quantum dots, precipitating the core-shell quantum dots in the presence of the supercritical liquid medium thereby forming the solid quantum dots material.

10. The method of claim 9, wherein precipitating the quantum dots in the presence of the supercritical liquid medium comprises at least adjusting temperature of the supercritical liquid medium.

11. The method of claim 10, further comprising purifying the quantum dots by separating the solid quantum dots material from the second reaction mixture comprising the supercritical liquid medium to form a separated solid quantum dots material, thereby substantially removing unreacted precursors from the solid quantum dots material.

12. The method of claim 1, further comprising drying the separated solid quantum dots material to form a dry powder.

13. The method of claim 1, further comprising dissolving the separated solid quantum dots material in a dispersing agent to form a quantum dots solution.

14. The method of claim 1, wherein the supercritical fluid medium comprises a supercritical carbon dioxide.

15. The method of claim 1, wherein the method is a continuous flow method.

* * * * *